United States Patent [19]

Jewett

[11] 4,248,645

[45] Feb. 3, 1981

[54] METHOD FOR REDUCING RESIDUAL STRESSES IN CRYSTALS

[75] Inventor: David N. Jewett, Harvard, Mass.

[73] Assignee: Mobil Tyco Solar Energy Corporation, Waltham, Mass.

[21] Appl. No.: 939,808

[22] Filed: Sep. 5, 1978

Related U.S. Application Data

[62] Division of Ser. No. 761,949, Jan. 24, 1977, Pat. No. 4,158,038.

[51] Int. Cl.³ ............................................ C30B 15/34
[52] U.S. Cl. ............................. 156/601; 156/DIG. 73; 156/608
[58] Field of Search ................. 156/601, 608, 617 SP, 156/620, DIG. 73, 619, DIG. 88; 422/249; 164/60

[56] References Cited

U.S. PATENT DOCUMENTS

| 3,342,559 | 9/1967 | Dermatis | 156/617 SP |
| 3,880,984 | 4/1975 | Akiyama | 156/619 |
| 3,961,905 | 6/1976 | Rice | 156/608 |

Primary Examiner—Hiram H. Bernstein
Attorney, Agent, or Firm—Schiller & Pandiscio

[57] ABSTRACT

A temperature profile controller is provided for cooling a crystal as it is pulled from a melt so that a substantially linear temperature gradient is established and maintained along the length of the crystal as it is cooled, whereby to prevent or reduce the occurrence of residual stresses in the crystal.

7 Claims, 9 Drawing Figures

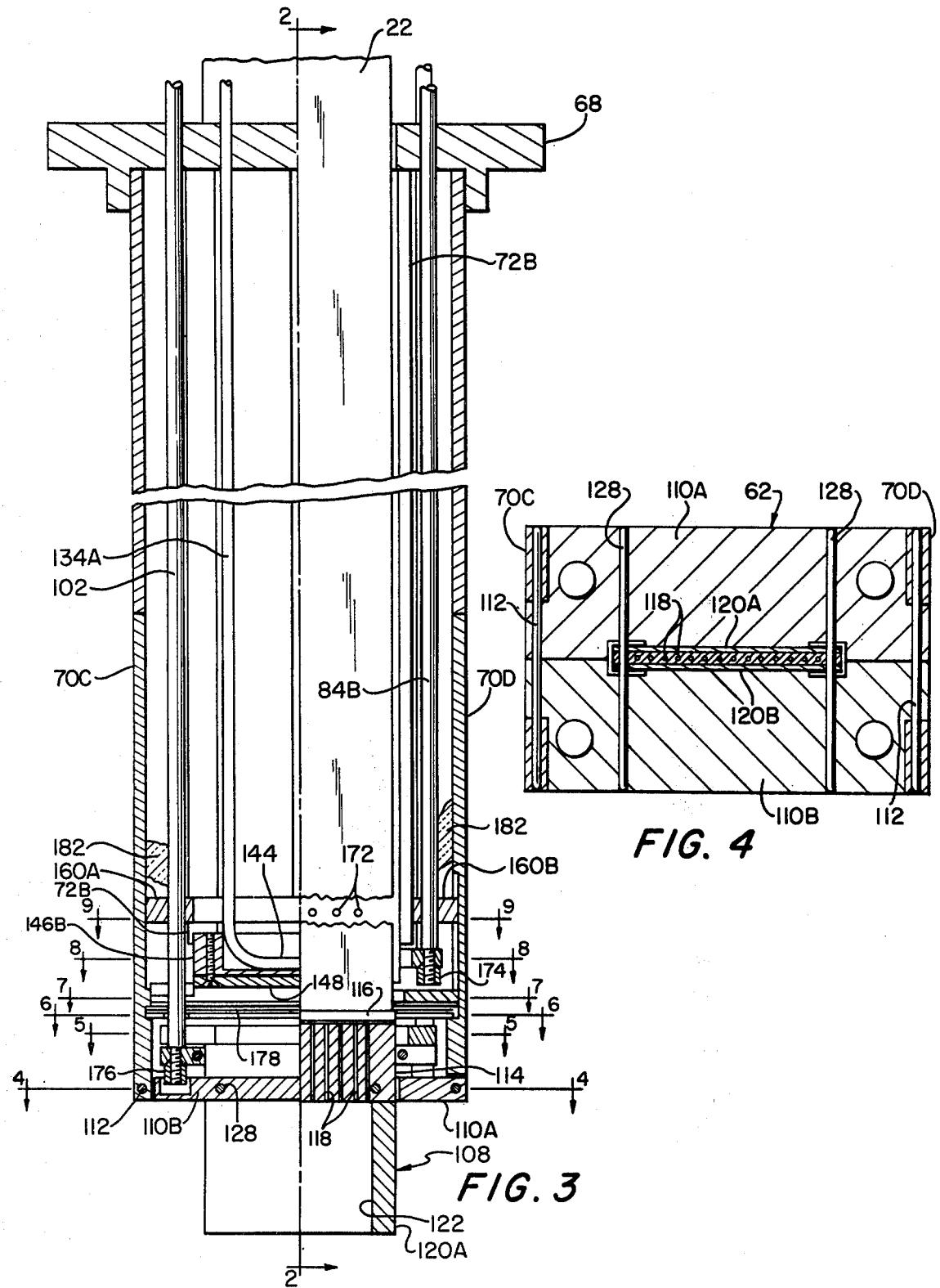

METHOD FOR REDUCING RESIDUAL STRESSES IN CRYSTALS

This is a division of U.S. application Ser. No. 761,949 filed Jan. 24, 1977 now U.S. Pat. No. 4,158,038 granted June 12, 1979.

This invention relates to the growth of crystalline bodies from a melt and more particularly to an improved apparatus and method for growing crystalline bodies having low residual stresses.

Attempts to grow ribbon-shaped crystals of silicon from the melt by various techniques, such as by use of capillary dies as disclosed in U.S. Pat. Nos. 3,591,348 and 3,471,366, or by laser recrystallization, the Inverted Stepanov technique or web-dendritic growth, have encountered problems with residual stresses in the grown crystals. Residual stresses in silicon ribbons can result in or promote fracture, buckling, plastic flow and creep. Common types of damage are spontaneous shattering of ribbons during growth or handling or fracture to an excessive extent during scribing of the ribbons in connection with cutting them into solar blanks. Attempts to remove the stresses by annealing have not been found to be satisfactory in the case of the silicon ribbon. Experience with silicon ribbon growth using the growth method described in U.S. Pat. Nos. 3,591,348 and 3,471,366 has indicated that the stress problem worsens with increases in growth rates and ribbon widths. I have also determined that silicon ribbons frequently suffer damage due to residual stresses as a result of being cooled along a relatively uncontrolled temperature gradient. Since increasing the growth rate and ribbon width are of primary importance in developing low-cost silicon solar cells, providing a solution to the problem of growing crystals without residual stresses is imperative.

Accordingly, the primary object of this invention is to provide a novel method and means for substantially eliminating or reducing residual stresses in crystalline bodies grown from a melt.

Another object of the invention is to provide a specific means for controlling the temperature distribution along a crystal as it is being grown so as to prevent or reduce the occurrence of residual stress.

Still another object is to provide a temperature profile controller for controlling the temperature distribution along the length of a crystalline body as the body is progressively pulled from a melt-solid growth interface, so as to reduce thermal stresses in the crystalline body.

Another more specific object is to provide silicon bodies which are substantially free of residual stresses due to thermal effects.

A further object is to provide a crystal body temperature profile controller which is designed to cause conduction lengthwise to be the predominant heat flow process along its length whereby to facilitate controlling temperature distribution along the length of the cooling crystalline body. More specifically, it is an object of the invention to provide a controlled temperature gradient heat conductor for establishing and maintaining a substantially linear temperature gradient in a crystalline body as the latter is cooled from a temperature close to the melting point to below the range of significant plastic flow.

These and other objects are achieved by providing a crystal body temperature profile controller which comprises an elongate heat-conducting medium that is disposed along the pulling axis of a crystal body downstream of the interface of the crystal body and the pool of melt from which it is drawn and defines a passageway through which the crystal body is drawn. The heat-conducting medium is adapted so that conduction is the predominant heat flow process at all points along its length and so that it induces a controlled temperature gradient, preferably a linear or near linear gradient, to be established and maintained along the length of the crystal body for at least a major portion of the time that it is being cooled from at or near its melting point to near or about the temperature below which it will not undergo significant plastic flow. A linear or near linear temperature gradient is established along the length of the heat-conducting medium by appropriately shaping and insulating it and by supplying heat to the high temperature end of the medium and removing heat from the low temperature end of the medium. Through heat exchange the heat conducting medium impresses a similar gradient in the crystal body.

Other features and many of the attendant advantages of this invention are described or rendered obvious by the following detailed specification which is to be considered together with the accompanying drawings wherein:

FIG. 3 is a vertical sectional view taken along line 3—3 of FIG. 9; and

Figure 1:
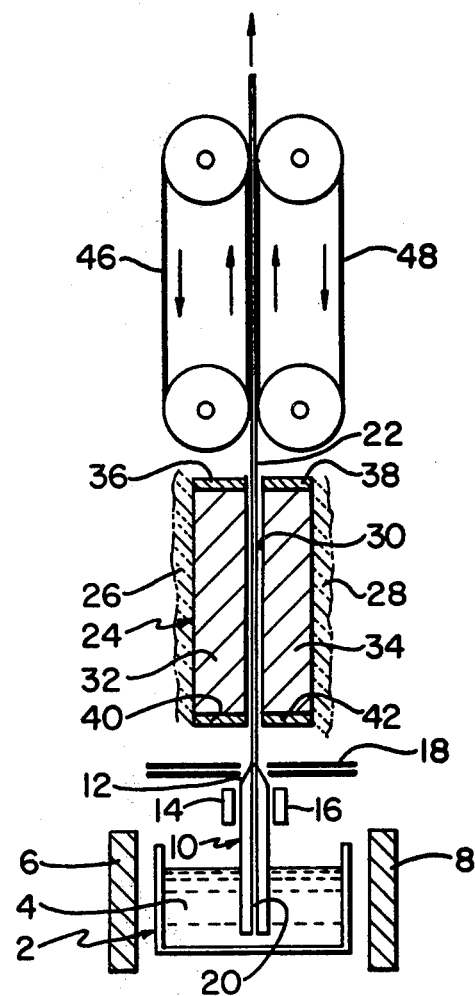
FIG. 1 is a schematic view illustrating the arrangement and function of the present invention.

FIGS. 4 through 9 are cross-sectional views taken along lines 4—4 through 9—9 respectively of FIG. 3.

Although the specific form of the invention hereinafter described is directed to growth of silicon ribbon, it is to be understood that the invention may be adapted for use in growing crystalline bodies of other materials and/or other cross-sectional shapes.

Residual stress is a stress system satisfying internal equilibrium with no external loads or temperature gradients; it is accompanied by an elastic strain distribution in the crystalline material. Residual stresses in crystals grown from a melt can be caused by mechanical effects (such as forced alignment of parts or loads causing non-uniform plastic flow or creep), by thermal effects, and by chemical or compositional effects. The thermal effects are exemplified by thermal stresses due to non-uniform changes in temperature of the crystal body causing plastic flow.

The present invention is concerned with the matter of thermal stress in the growth of ribbon shaped crystals, and the effect of thermal stress on plastic strain induced deformation and perfections and the residual stresses in the grown crystals. Residual stresses can generally be relieved by small amounts of relaxation or plastic strain. If residual stresses are present, they can cause or promote fracture, buckling, plastic flow and creep. By way of example, the residual stresses in silicon ribbon may be as high as 30,000 psi (the fracture stress of silicon at room temperature is approximately 80,000 psi). Residual stresses in a grown crystal result from the plastic deformation which the crystal undergoes at high temperatures. The plastic deformation in turn is usually caused by thermal stresses which arise as a result of non-uniform temperature distributions in the ribbon. Hence, it is desirable to minimize the extent of plastic deformation and, therefore the strain induced imperfections; it also is desirable to reduce to a tolerable level the residual plastic stress in the crystal when it reaches room temperature.

One possible explanation for the occurrence of residual stresses due to a non-uniform temperature gradient is as follows: Consider that a substantially monocrystalline silicon ribbon consists of a number of narrow strips each extending lengthwise of the ribbon and that each strip will contract proportional to its own temperature fall when the ribbon is cooled from the melting point to room temperature. If the ribbon is in a uniform temperature gradient, each strip of the ribbon will contract in the same manner as each adjacent strip. Accordingly, the ribbon will be stress-free and will remain stress-free as long as it is in the same temperature gradient. However, if the temperature gradient becomes non-uniform, i.e. non-linear, then adjacent strips of the ribbon will contract differentially and will restrain each other's contraction instead of conforming to one another, with the result that thermal stresses will arise. It appears that these thermal stresses will vary with the rate of change of the temperature gradient and also with increasing ribbon width. In a realistic crystal growth situation, it is believed to be impossible to cool a ribbon or other crystalline body to room temperature without developing stress in the body at some point. Nevertheless, the closer the temperature gradient along the crystalline body is made linear, the closer the crystal will approach a state of no thermal stress.

One possible solution to the residual stress problem in silicon ribbons would be to subject the ribbons to a process of annealing at a high enough temperature such that stress relaxation could occur. However, although annealing can be successful in reducing residual stresses in moderately stressed ribbons if the ribbons are annealed at about 850° C. for at least about 25 minutes, similar treatment of highly stressed ribbons, e.g. ribbons with stresses above 20,000 psi, does not give satisfactory results. Moreover in the latter case, the ribbons frequently shatter on being loaded into the annealing furnace. In any event, annealing means an extra step is added to the growth process.

The present invention provides a device for establishing a region of constant or near constant temperature gradient in which a ribbon or other form of crystal cools and is stress-relieved without at the same time introducing any stress or strain in the ribbon. In its basic aspect the device, hereinafter called a crystal temperature profile controller, consists of a heat conducting medium which is rectilinear in form and is disposed along the pulling axis of the crystal close to but downstream of the melt/growth interface, with the downstream (higher) end of the controller being at a substantially lower temperature than its upstream (lower) end. The heat conducting medium is insulated in a manner to minimize radiation losses from its outer surfaces and to cause conduction to be the predominant heat flow process along its length. The heat conducting medium also is arranged so that it can exchange heat with the moving crystal body by radiation and conduction and so that it will induce in the adjacent crystal a thermal distribution lengthwise which corresponds closely to its own.

The most desirable temperature distribution established in and by the heat conducting medium is one which decreases linearly from a suitably high temperature, below the melting point of the crystal material, at which stress relief takes place almost instantaneously to a temperature below the point or range of significant plastic flow. In this connection it is to be noted that I have discovered that heat must be supplied to at least the low (higher temperature) end of the heat conducting medium in order for the latter to attain a high enough temperature to be able to establish a linear or near linear temperature gradient along the grown crystal as it is cooled down from its temperature at the growth interface to room temperature or at least a temperature at which plastic flow will not occur. Heat may be supplied to the higher temperature (lower) end of the temperature profile controller by various modes from various sources, e.g. by radiation and/or conduction from heaters disposed in the region of the melt/crystal growth interface and/or the crucible and/or the lower end of the heat-conducting medium. In the preferred form of the invention, the higher (lower temperature) end of the heat conducting medium is connected to a metal heat sink, while heat is supplied to its higher temperature end by one or more heaters located at or near that end. The heater(s) may be located externally of or even within the heat conducting medium. The power dissipated by the heater(s) through the heat conducting medium and the temperature gradient along that medium are determined by the thickness of the conducting medium, the temperature at its opposite ends, and its length along the growth axis.

As noted above, heat must actually be supplied to the lower end of the heat conducting medium in order to establish and maintain a linear or near-linear temperature gradient therein. This requirement is due to the fact that the crystal and the heat conducting medium are not perfectly insulated against undesired heat loss, and the thermal environment near the growth interface usually does not provide enough heat to maintain the lower end of the heat conducting medium at a suitably high temperature.

It is to be noted that the heat conducting medium also serves as a source of heat for the ribbon to compensate for the effect in ribbon cooling of the fact that the thermal conductivity of silicon increases with decreasing temperature. The effect of this inverse temperature dependence can be appreciated by considering an element of volume of a hot silicon ribbon between temperatures $T_1$ and $T_2$ where $T_1$ exceeds $T_2$. Even if the element of volume of the ribbon were perfectly insulated against convectional and radiative heat losses, the gradient at $T_1$ would be less than at $T_2$ because of the inverse temperature dependence of the thermal conductivity. If additional heat is lost by that element by radiation or convection, the rate of change of the temperature gradient ($d^2T/dx^2$) will be even more positive. Therefore, in order to obtain a linear gradient, heat must actually be put into each element of volume of the ribbon. Of course, introducing heat into each element of volume could have the effect of limiting the rate of growth as the convective and radiative heat losses from the ribbon surface at the high temperatures help to carry away the latent heat which originates at the melt/solid interface. However, the heat of fusion is substantially fully dissipated at temperatures above that at which the temperature profile controller is applied. Thus, the heat conducting medium of the temperature profile controller supplies a small amount of heat to the crystal to compensate for the effect of thermal conductivity on temperature gradient, while allowing the crystal to cool down without introducing significant residual stress.

The heat conducting medium of the temperature profile controller also has a thermal conductivity which varies inversely with temperature. Accordingly, the design of the heat conducting medium must take this factor into account if it is to have a linear or near linear temperature gradient. As already noted, the temperature profile in the heat conducting medium is influenced by the dimensions of that medium. The smaller the cross-sectional area of the heat-conducting medium, the greater the temperature gradient. Hence, the heat conducting medium can be trimmed, i.e. adjusted closer to the desired isotherms by locally changing the thickness of the heat conductor. Therefore, although the insulated heat conductor may have a uniform thickness along its length and still provide a uniform or near uniform temperature gradient from end to end, the invention offers the advantage that the gradient in the heat conducting medium may be made more uniform if the heat conducting medium is tapered so that its hotter end is thicker than its colder end, whereby the tendency of the high temperature of the hotter end to decrease the thermal conductivity at that end is offset by the similar effect produced by making the cooler end thinner.

FIG. 1 illustrates application of the present invention to a system for continuously growing silicon ribbon. In FIG. 1 there is shown a crucible 2 which contains a supply of silicon 4. The crucible is disposed in a furnace enclosure (not shown) which contains heating means represented schematically at 6 and 8 which are used to maintain the supply of silicon in a molten state. Associated with and extending into the crucible is a graphite capillary die 10 which is shaped for growing flat ribbons. The lower end of the capillary die is submerged into the silicon melt 4. Although it is not shown in detail, it is to be understood that at its upper end the breadth of the die (i.e. the dimension of the die 10 which is perpendicular to the plane of the drawing) is substantially greater than its width (i.e. the left-to-right dimension of the die in FIG. 1) so that the edge configuration of its upper end is rectangular as required for opening a thin ribbon. The upper end of the die is bevelled on its opposite broad sides as shown at 12. Disposed close to but below the upper end of the die is a die heating means represented schematically as two heater elements 14 and 16. The upper end of the die is surrounded by 1 or more radiation shields as shown at 18 which serve to limit radiative heat loss from the upper end of the die. In the normal operation, a ribbon 22 is continuously grown from the upper end of the die and the melt consumed in formation of the crystal is replaced by upward flow of melt in the capillary 20 of the die.

Disposed above and spaced from the radiation shield is a temperature profile controller comprising a heat conductive medium 24 which is arranged to form a linear cooling zone. Accordingly, medium 24 is insulated on its outside by suitable heat insulating means represented schematically at 26 and 28. The heat conductive medium is arranged so as to provide surfaces which extend parallel to and lie closely adjacent to the opposite broad sides of the ribbon. While the heat conducting medium 24 may consist of a single block with a passageway 30 formed therein for passage of the ribbon 22, it is preferred that the heat conductive medium consist of two discrete blocks 32 and 34 of identical shape and size disposed on opposite sides of the ribbon. In the preferred form of practicing the invention, heat is removed from the upper end of the heat conducting medium 24 by suitable heat sink means represented schematically at 36 and 38 while heat is supplied to the lower end of the same medium by a suitable afterheater means represented schematically as two afterheater elements 40 and 42, whereby a temperature gradient is established lengthwise in the heat conducting medium with the lower end of the heat conducting medium at a substantially higher temperature than the upper end of the same medium. The crystal 22 is continuously pulled by means of a suitable pulling mechanism which preferably, but not necessarily, is of the type comprising a pair of endless belts 46 and 48 which are arranged to grip the opposite broad sides of the crystal. One form of suitable endless belt pulling mechanism is disclosed in U.S. Pat. No. 3,607,112 issued Sept. 21, 1971 to Seymour Mermelstein for Endless Belt Seed Crystal Gripping and Pulling Means. Such a puller is adapted to pull a ribbon or other form of substantially monocrystalline body at a precisely controlled speed.

A fast cooling zone is provided between the heat conducting medium 24 and the upper end of the capillary die. This fast cooling zone may consist merely of a space between the die and the afterheater sufficient to permit rapid cooling of the crystal at and for a short length above the liquid/solid interface, or auxiliary cooling means as disclosed by U.S. Pat. No. 3,265,469, issued Aug. 9, 1966 to R. N. Hall, may be provided to increase the rate at which the latent heat of fusion is removed. This fast cooling facilitates crystallization and thus makes it possible to grow the ribbon at a higher speed than would otherwise be possible.

The temperature profile controller is arranged so that (1) its afterheater and heat sink means cause its heat conductive medium 24 to be at a temperature close to but below the melting point of silicon at its lower end and at a temperature close to but preferably below the temperature at which significant plastic flow will occur at its upper end, (2) its heat conductive medium will have a substantially constant temperature gradient along the length of the ribbon as the ribbon passes by, and (3) the ribbon will be at a temperature below that at which no significant plastic flow will occur therein as or immediately after it passes beyond the upper end of heat conducting medium. As a result, the ribbon will have little or no residual stresses after it has cooled to room temperature. It is significant to note the melting point of silicon is about 1415° C. and that little significant plastic flow will occur in substantially monocrystalline silicon after it has been cooled to below a temperature of between about 600° C. and about 800° C. Preferably for silicon the temperature profile controller is arranged so that the vertical temperature gradient of its medium 24 is constant at some value between about 150° and 600° C./cm, with the temperature at its lower end between about 1050° and 1250° C. and the temperature at its upper end at about 600° C. or less. While the vertical temperature gradient of the heat conductive medium is preferably constant, it may vary somewhat and still permit a crystal of ribbon or other material to be grown without significant residual stresses. A significant residual stress in a silicon crystal body is considered to be a stress in excess of about 300 psi. Obviously the foregoing temperature and gradient values are only for silicon and different values will be required for different materials, e.g. sapphire or lithium niobate.

FIGS. 2–9 illustrate apparatus constituting a preferred form of practicing the invention in connection with growing silicon ribbons. In these figures, there is shown a furnace in the form of an enclosure 50 which is formed with the sight ports 52 for viewing crystal growth. Mounted within the furnace by means of a suitable support 54 is a quartz or graphite crucible 56 which is elongated perpendicular to the plane of the drawing. Also disposed within the furnace enclosure are a plurality of elongate electrical resistance graphite heaters 58. Although not shown, it is to be understood that these heaters are connected to a suitable electrical power supply located externally of the furnace. Heaters 58 are spaced and disposed so as to supply heat to the crucible to convert the silicon feed material which it contains to a melt 60. The upper end of the crucible is closed off by a graphite cover member 62 which is attached to and forms part of a unitary cartridge 64. As described hereinafter in greater detail, each cartridge contains a capillary die, means for providing a fast cooling zone above the upper end of the die, and means for establishing a linear cooling zone above the fast cooling zone.

Figure 2:
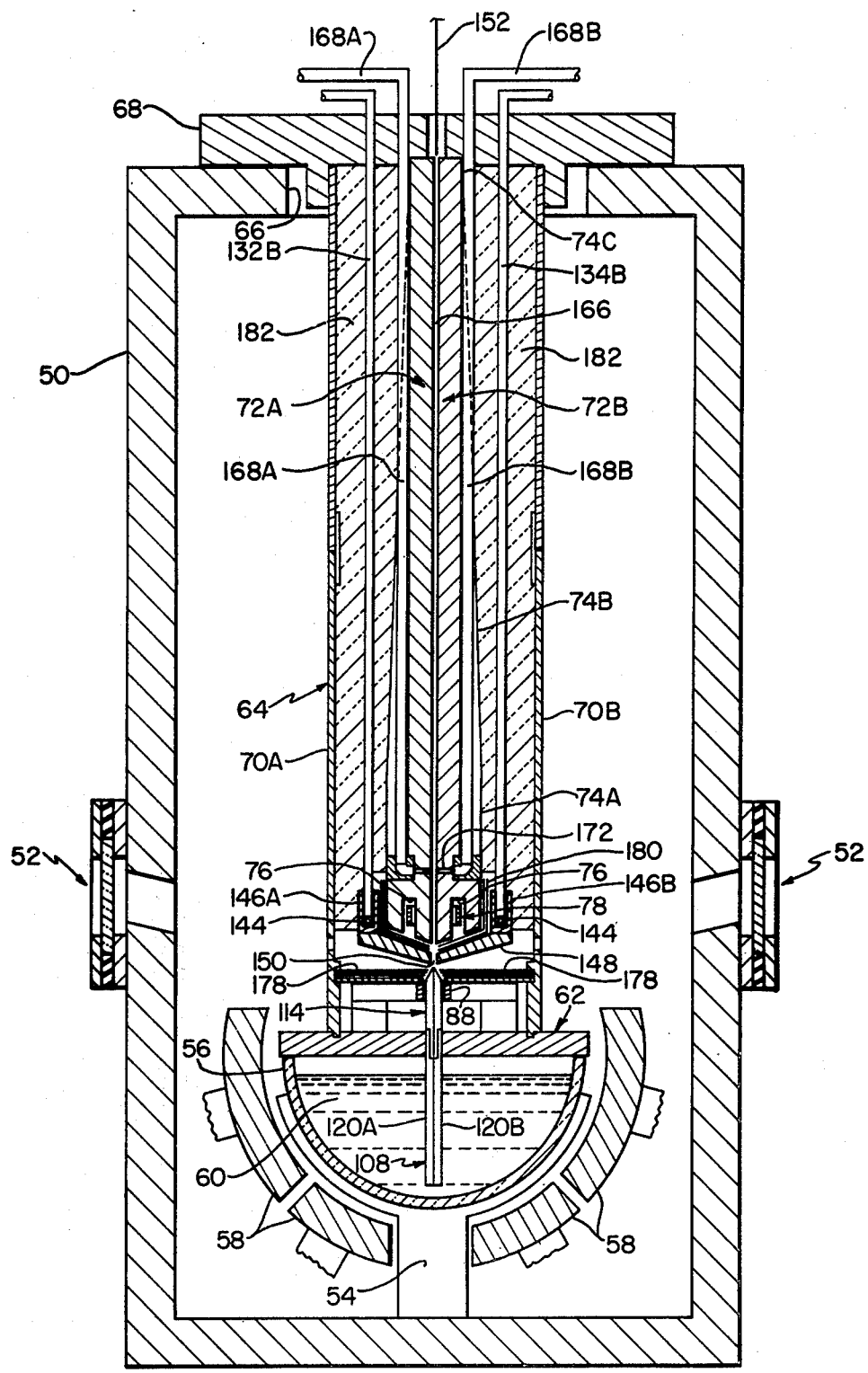
FIG. 2 is a vertical sectional view, taken along a line corresponding to line 2—2 of FIG. 3, of apparatus incorporating a preferred embodiment of the invention for growing silicon ribbons.
Figure 5:
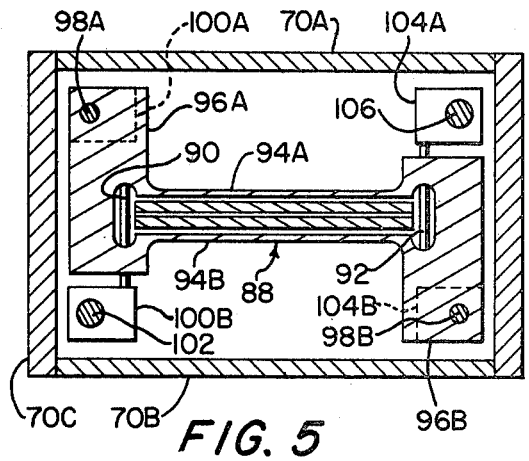
Figure 6:
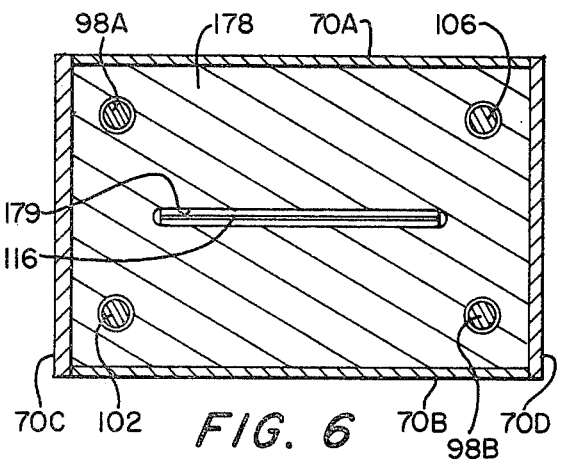
Figure 7:
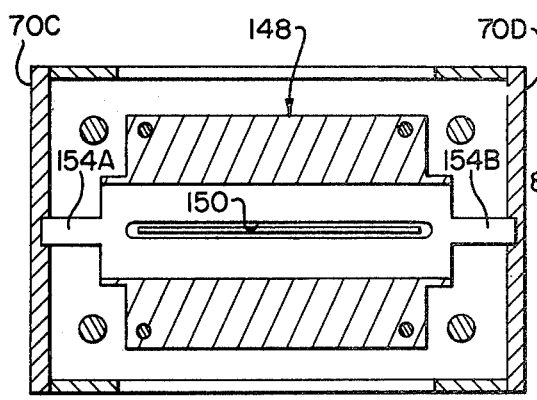

The upper end of furnace enclosure 50 is formed with an access port 66 through which cartridge 64 may be introduced into the furnace enclosure and disposed as shown in FIG. 2. The upper end of the cartridge preferably comprises a metal header plate 68 which serves as a heat sink in the manner of the heat sink means 36 and 38 of FIG. 1 and also determines by engagement with the upper end wall of the furnace the extent to which the cartridge may be lowered into the furnace.

Cartridge 64 comprises an outer housing of rectangular cross-section made up of four walls 70A, 70B, 70C and 70D which are made of a heat resistant material and are attached to and depend from header 68. Cover member 62 is attached to and supported by walls 70A–D. Disposed within the same housing and attached to and depending from header 68 are two heat conductive graphite plates 72A and 72B. These plates form the heat conductive medium of the temperature profile controller and correspond to the blocks 32 and 34 of FIG. 1. In this preferred mode of practicing the invention, plates 72A and B are shaped so as to assist in providing a controlled substantially linear temperature gradient along their lengths. Thus, as shown in FIG. 2, plates 72A and B do not have a uniform thickness along their lengths. Instead for a short distance extending up from their lower ends the broad outer surfaces of plates 72A and B extend parallel to their straight inner surfaces as shown at 74A and thereafter as indicated at 74B the outer surfaces are slanted and converge at a fixed angle toward the inner surfaces. For a short distance adjacent their upper ends the outer surfaces again extend parallel to their flat vertical inner surfaces as shown at 74C in order to facilitate attachment of the plates to header 68.

Figure 8:
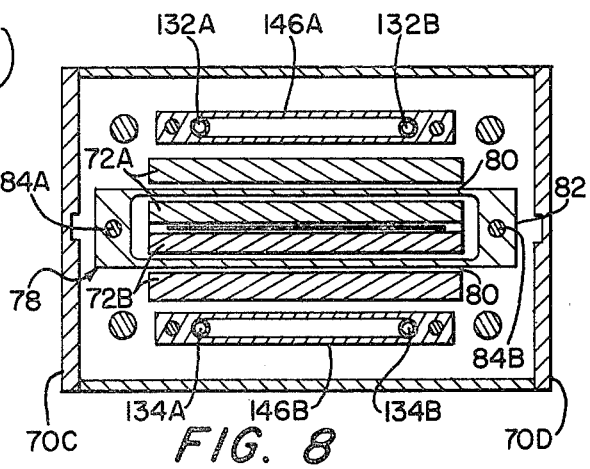
Figure 9:
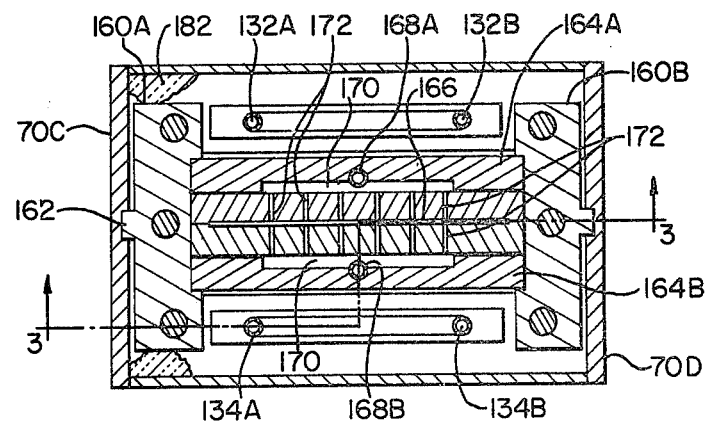

As seen in FIGS. 3, 8 and 9, the opposite edge surface of plates 72A and B are flat and extend vertically.

Referring now to FIGS. 2, 3 and 5–9, the lower ends of plates 72A and B are notched to form two elongate parallel recesses 76 to accommodate side portions of an electrical resistance afterheater 78 made of graphite. As seen in FIG. 8, afterheater 78 is in the form of a generally rectangular bar having a rectangular aperture, with the resulting side sections 80 extending along recesses 76 and the resulting end sections 82 extending alongside of the opposite edge surfaces of plates 72A and 72B. Afterheater 78 is affixed to and supported by a pair of electrical current feed bars 84A and B which are anchored in header 68.

Still referring to FIGS. 2, 3 and 5–9, the cartridge also includes a die face heater 88 and a pair of die end heaters 90 and 92. Face heater 88 is made of an electrically conductive material and comprises a pair of parallel face heating sections 94A and B and a pair of terminal sections 96A and B. The latter are affixed to a pair of electrical current feed bars 98A and B respectively. End heater 90 is mounted in two conductive blocks 100A and B which are secured to current feed bar 98A and an electrical current feed bar 102 respectively. End heater 92 is mounted in two conductive blocks 104A and B which are secured respectively to an electrical current feed bar 106 and feed bar 98B. Heaters 88, 90 and 92 are made of graphite and are disposed so as to heat the sides and ends of the upper end of a capillary die 108.

Referring now to FIGS. 2–4, the cover member 62 actually consists of two graphite plates 110A and 110B which extend into slots formed in walls 70C and 70D and are locked thereto by pins 112, while the bottom ends of walls 70A and B form a tongue and groove connection with the same plates as shown in FIG. 2.

Still referring to FIGS. 2–4, die 108 is made of graphite and comprises an upper capillary section 114 having a narrow horizontal capillary slot 116 extending for the full breadth of its upper end and a plurality of vertical capillary holes 118 which intersect slot 116. The lower end of the upper capillary section is sandwiched between two graphite plates 120A and B whose inner surfaces are milled to form a lower capillary 122. Plates 120A and B in turn are sandwiched between plates 110A and 110B. The upper and lower die sections are pinned together by two pins 128 which extend through plates 110A and 110B as shown in FIGS. 3 and 4.

Referring now to FIGS. 2, 3, 8, and 9, two pairs of cooling pipes 132A,B and 134 A,B are attached to and depend from header 68 in spaced relation to the outer surface of cooling plates 72A and B. Pipes 134A and B are connected at their bottom ends by a horizontal or transverse section 144. Pipes 132A and B are similarly connected at their lower ends by like transverse section 144 (not shown). These lower transverse sections 144 are disposed within cavities formed in two like molybdenum cooling shoes 146A and B. These shoes are affixed to pipe sections 144 so that effectively the shoes are carried by those pipes. Shoes 146A and B are disposed adjacent the lower ends of heat conducting plates 72A and B and are attached to opposite sides of a cooling plate 148 which is U-shaped in one plane (FIG. 2) and has an elongate center hole 150 through which the growing crystal 152 can be pulled. The ends of plate 148 are formed with tongues 154A and B which fit into guide grooves formed in housing walls 70C and 70D. Cooling plate 148 extends beneath the afterheater plates immediately above the upper end of the capillary die. Cooling plate 148 is made of graphite and may take various shapes, but preferably it is tapered on opposite sides of hole 150 as shown in FIG. 2. Cooling pipes 132 A,B and 134A,B are connected to a source of cooling water (not shown) by suitable means (also not shown) comprising external piping and a pump. Based upon the foregoing description, it is seen that parallel cooling fluid circuits are provided whereby cooling water fed into the cartridge via pipes 132A and 134A will flow back out through pipes 132B and 134B, and thereby will remove heat from cooling shoes 146A and B and cooling plate 148.

As seen in FIGS. 4-9, the upper ends of the six current feed bars are anchored in and extend through header 68. They also extend down through a pair of locater plates 160A and B which are formed with ribs 162 that fit in guide slots formed in the wall members 70C and 70D. Locater plates 160 are notched at their confronting surfaces to accommodate the two heat-conductive plates 72A and 72B and also two gas feed insert plates 164A and 164B. The latter are secured in mating notches (see FIG. 2) provided in plates 72A and B and coact with locater plates 160 to hold the bottom ends of the plates 72A and B tight against one another and also fixed with respect to the remaining components of the cartridge. In this connection it is to be noted that the inner faces of plates 72A and B are formed with corresponding flat recesses which are relatively shallow but are sufficient to provide a narrow passageway 166 for the flat ribbon which is to be grown. Passageway 166 is aligned with hole 150 of plate 148.

Means for feeding a cooling gas also are provided. Such means comprise a pair of relatively small diameter metal pipes 168A and 168B which are secured to and depend from header 68. These pipes are connected at their upper ends to a source of cooling gas (not shown). The lower ends of pipes 168A and 168B are secured in holes formed in gas feed insert plates 164A and 164B which are attached to plates 72A and B. It should be noted that in this particular embodiment the plates 72A and B are notched vertically to accommodate pipes 168A and B (see FIG. 2). Each plate 166A and B is made of a heat resistant material and is notched so that it and the adjacent cooling plate 72 (A or B) forms a manifold chamber 170. Each of the heat conductive plates 72A and B is provided with a plurality of small openings 172 that communicate with manifold chambers 170, whereby gas introduced via pipes 168A and B will pass from manifold chambers 170 into the elongate space 166 formed between plates 72A and B. Although not shown, it is to be understood that pipes 168A and B are connected to a suitable source of a cooling gas having predetermined thermal conductivity. Preferably the gas is helium or argon and it is introduced to the upper ends of pipes 168A and B under a slight positive pressure and at a rate just high enough to maintain a gas environment between plates 72A and B.

The lower ends of current feed bars 84A and B terminate at and support heater element 78. For this purpose and as shown in FIG. 3, each feed bar has a reduced diameter end section which extends through an end section 82 of the heater element and is threaded to receive a nut 174 which locks it to the heater element. Still referring to FIGS. 2-5, the lower ends of feed bars 98A and B, 102 and 106 also are threaded to receive nuts 176 which serve to lock blocks 100A and B and 104A and B onto the bars. These same feed bars also pass through a plurality of mutually spaced flat plates 178 which form a multi-layer die shield. Plates 178 rest on shoulders formed in side walls 70A-70D of the cartridge housing. Plates 178 all have elongate center slots 179 through which extends the upper end of die 108. Plates 178 are located so that the uppermost one is flush with or slightly below the upper end surface of the die. A second set of mutually spaced radiation shields 180 are disposed between cooling shoes 146A and B and plates 72A and B respectively to prevent heat from flowing to the cooling shoes from the lower ends of the cooling plates.

A suitable heat insulating material 182, e.g., graphite felt, is packed into the housing around plates 72A and B as shown to reduce heat loss. For convenience of illustration only a portion of insulation 182 is shown in FIGS. 3 and 9.

Following is a specific example of the method of this invention based upon use of the preferred structure of FIGS. 2-9. The die is dimensioned so that at its upper end its outer edge configuration defines a rectangle measuring 0.014 inch by 2.0 inch. The two graphite plates 72A and B are about 8.0 inches long and 2.25 inches wide, and have a thickness varying from about 0.50 inch at the bottom end to about 0.25 inch at the upper end. Assuming that crucible 56 is filled with a melt of silicon, the cartridge 64 is disposed as shown in FIG. 2 so that the lower end of die 108 is submerged in the melt. The molten feed material rises to the top of the die. Heat is supplied to the system by energizing the heaters previously described so that (1) the temperature of the die in the region of heater 88 is about 10°-30° C. above the melting point of silicon and (2) the temperature of plates 72A and B in the region of heater 78 is about 1200° C. Cooling water is circulated through pipes 132 and 134 so as to keep cooling plate 148 at a temperature of about 600°-900° C. The temperature of the upper ends of plates 72A and B is about 600° C. Helium gas is fed into the cartridge via pipes 168A and B at a rate of about 10 scfh. Thereafter, in the manner described in U.S. Pat. Nos. 3,591,348 and 3,607,112, a seed crystal is lowered by means of a pulling mechanism through passageway 166 and hole 150 so as to make contact with the top of the die. The lower end of the seed crystal melts and connects with the molten material at the upper end of the die. Thereafter, the crystal pulling mechanism is operated so as to cause the seed crystal to be pulled upwardly at a selected rate in the range of 1-3 inches/minute. As the seed crystal is pulled upwardly, a flat substantially monocrystalline silicon ribbon 22 measuring about 0.01 inch thick by about 2.0 inch wide is continuously formed on the seed. The resulting ribbon is cooled to room temperature after it passes out of furnace enclosure 50 by radiation, conduction and convection. The formed ribbon has dimensional stability and is substantially free of residual stresses of a magnitude which will cause fracture, buckling, plastic flow and creep.

The apparatus described above makes it possible to grow substantially monocrystalline silicon ribbon of controlled size and free of residual stresses at optimum speeds and with precise control of the several growth parameters. The cooling zone provided by cooling plate means 148 directly above the die makes is possible to rapidly remove the heat of fusion and plates 72A and 72B make it possible to produce a constant temperature profile in the ribbon as it cools. This helps to prevent and eliminate residual stresses in the ribbon and also permits growth of crystalline bodies at a relatively high rate.

An interesting aspect of this invention is that gas is introduced via pipes 168A and B not for the purpose of convection cooling the formed crystal but instead to provide a high thermal conductivity medium between the crystal and plates 72A and B and 148. Hence the gas does not have to be cooled when it is introduced into the system in order to serve its intended purpose. Helium has a better thermal conductivity than argon and hence it is preferred. However, a mixture of those gases and/or some other gas of selected thermal conductivity may be used in place of helium or argon. Preferably the gas is introduced close to cooling plate 148 as shown so that it will flow down through opening 150 as well as up between plates 72A and B. The gap between each side surface of the hot crystal and the adjacent portions of plate 148 and plates 72A and B is kept small, preferably less than about 0.03 inch. A gap of approximately the same size is kept between the side edges of the ribbon and plates 148, 72A and 72B. By keeping the gap between plate 148 and the ribbon filled with a gaseous heat conducting medium, there is achieved the result that radiative heat transfer between the crystal and the adjacent portions of that plate is supplemented by conductive heat flow. The same is true between the ribbon and plates 72A and B. This is important in allowing silicon ribbons free of residual stresses to be grown at a rate in excess of 2.0 inch/minute. The gas also insures a clean environment for the growing crystal body.

Shaping the plates 72A and B to achieve the desired temperature gradient lengthwise along the pulling axis is accomplished in accordance with the fact that heat flow along those plates may be expressed as $$H = kA\Delta T$$

where H is the heat flow, k is the thermal conductivity of the graphite of which the plates are made, A is the cross-sectional area of the plate, and $\Delta T$ is the thermal gradient. Since k varies as an inverse function of temperature and H is relatively constant during crystal growth (the temperature profile controller is arranged so that conduction lengthwise is the predominant mode of heat flow in the plates, whereby the heat loss at the top is substantially equal to the heat input at the bottom), it is possible by changing the cross-sectional area of the plates, preferably by keeping the width constant and varying the thickness, in accordance with the values of k at different points, to provide plates which have a linear temperature gradient along their length and consequently along the length of the crystal which is interposed between them. In the apparatus of FIGS. 2–9 the plates 72A and B have a substantially constant temperature from one side edge to the opposite side edge, i.e., horizontally as viewed in FIGS. 2, 3 and 9.

It is to be noted that plates 72A and B have a breadth greater than the grown ribbon and thus extend beyond the side edges of the ribbon, as shown in FIGS. 3 and 9. Making the plates 72A and B so that they extend beyond the side edges of the grown crystal is important since otherwise heat losses from the edges of the ribbon will result in residual stresses. For this reason, the temperature profile controller is arranged so that the heat conductive medium includes portions that extend up along and close to the side edges of the ribbon (see FIG. 9) and the insulation 182 extends around the side edges of plates 72A and B.

Changes may be made in the invention so that it may be practiced other than as specifically shown herein. Thus, for example, header 68 and/or the upper end of plates 72A and B may be modified to permit the circulation of a cooling fluid therein for the purpose of maintaining the upper ends of those plates at a precise temperature. Another possible modification is to change the shape of the mutually confronting inner surfaces of plates 72A and B to make them conform to the shape of the growing crystal, in the event the invention is used in connection with growing crystals in shapes other than flat ribbons. Thus, for example, if the capillary die is designed to grow cylindrical tubes of silicon, the inner (and optionally also the outer) longitudinal surfaces of plates 72A and B will be made with a circular curvature in cross-section to conform to the cross-sectional shape of the grown crystal body. It also is possible to eliminate one of the plates 72A or B and replace it with a heat insulating plate. In such case the remaining heat conductive plate will still induce a similar temperature gradient in the ribbon. Also in the case of growing a closed shape such as a cylindrical tube, a heat insulator may be disposed within the growing tubular crystal to limit radiative heat transfer vertically within the inside of the tube. Still other modifications will be obvious to persons skilled in the art.

What is claimed is:
1. Method for growing a crystalline body of a selected material from a melt of the same comprising:
 (a) establishing a melt/solid growth interface between a seed crystal and a melt which is located at the upper end of a capillary die and is replenished by said die, growing a crystalline body and drawing said growing crystalline body progressively from said interface along a predetermined axis, passing said crystalline body through a cooling zone having a temperature profile determined at least in part by a block of heat-conductive material closely confronting and defining a passageway for said growing body and insulation means surrounding said heat-conductive material for causing conduction to be at the predominant heat flow process at all points along the length of said block of heat conductive material, said block of heat-conductive material having at one end thereof closest to said growth interface a temperature which is below the melting point of said selected material but is at a level above the maximum temperature at which significant plastic flow cannot occur in said body of selected material, said block of heat-conductive material having at the opposite end thereof furthest from said growth interface a temperature below said maximum temperature;

progressively reducing the temperature of said growing body in said cooling zone in accordance with temperature profile established by said heat-conductive material, and thereafter passing said crystalline body through a secondary cooling zone for reducing its temperature to substantially room temperature.

2. A method according to claim 1 wherein said selected material is silicon and said crystalline body is at a temperature of between about 1050° C. and about 1250° C. at one end of said block of heat-conductive material and reaches a temperature of between about 600° C. and about 800° C. when it passes out of the opposite end of said block of heat-conductive material.

3. Method according to claim 2 wherein said block of heat-conductive material is made of graphite.

4. Method according to claim 1 further including the step of electrically heating said block of heat-conductive material at the one end thereof which is closest to said melt/solid growth interface, and removing heat from said opposite end of said heat-conductive block which is furthest from said melt/solid growth interface.

5. Method according to claim 4 wherein the temperature of said block of heat-conductive material has a substantially linear gradient from said one end thereof closest to said melt/solid growth interface to said opposite end thereof which is furthest from said melt/solid growth interface.

6. Method according to claim 2 wherein said body is in the form of a substantially flat ribbon.

7. Method according to claim 6 wherein said first-mentioned cooling zone is determined at least in part by two parallel blocks of heat-conductive material.

* * * * *